United States Patent
Kjosness et al.

(10) Patent No.: US 7,977,996 B1
(45) Date of Patent: Jul. 12, 2011

(54) PULSE GENERATOR WITH PRECISION EDGE PLACEMENT

(75) Inventors: David Paul Kjosness, Longmont, CO (US); Bryan D. Boswell, Loveland, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 29 days.

(21) Appl. No.: 12/645,563

(22) Filed: Dec. 23, 2009

(51) Int. Cl.
*G06F 1/04* (2006.01)
(52) U.S. Cl. ............... 327/291; 327/298; 708/313
(58) Field of Classification Search ............ 327/291, 327/298; 708/300, 313; 375/232, 234, 237–239
See application file for complete search history.

(56) References Cited

U.S. PATENT DOCUMENTS

| | | | | |
|---|---|---|---|---|
| 6,058,406 A | * | 5/2000 | Karanovic | 708/313 |
| 7,205,924 B2 | * | 4/2007 | Vemulapalli et al. | 341/166 |
| 2008/0298454 A1 | * | 12/2008 | Lewis | 375/238 |

* cited by examiner

*Primary Examiner* — An T Luu (57) ABSTRACT

A digital pulse generator including a fractional delay filter is provided as having a plurality of step response functions that can be selected on a sample by sample basis by selection of filter coefficients. The step response functions are all identical but each have different group delay. Responsive to an input waveform having leading and trailing edges aligned with a system clock, the fractional delay filter can output the impulse responses as a pulse waveform having respective leading and trailing edges delayed by different respective fractions of a signal clock cycle from the respective leading and trailing edges of the input waveform. The pulse waveform as output can thus have desired pulse width and desired period of repetition with finer edge placement resolution of improved accuracy.

20 Claims, 8 Drawing Sheets

PULSE GENERATOR WITH PRECISION EDGE PLACEMENT

BACKGROUND

Pulse generators are used to generate pulse signals, which are generally characterized by a constant high level, a constant low level, and rapid transitions between the two levels. Typically, the placement in time of those transitions, also known as "edges", is of great importance to users of pulse generators.

Analog pulse generators are a class of pulse generators that use analog integrators and comparators to place edges of the waveform, and that are capable of fine edge placement resolution. However, analog circuits are subject to component tolerances, non-linearity, and noise, may drift with time and temperature change, and thus their accuracy is generally limited. Also, uncorrelated noise may cause the analog pulse generator to switch earlier or later than intended, leading to unpredictable edge-placement errors known as jitter.

Digital pulse generators are another class of pulse generators, which use digital counters instead of analog circuits to determine pulse width and period of repetition, which can improve accuracy and jitter. However, a disadvantage of digital pulse generators is that, in general, edges of the generated pulse waveform occur coincidentally with clock edges, resulting in limited edge placement resolution.

Another class of pulse generators includes analog/digital hybrid pulse generators which combine digital counters with analog circuits to provide good edge placement resolution. The digital counters are used to determine pulse width and pulse repetition to within one clock period, and the analog circuits provide up to one clock period of finely controlled delay. However, the analog circuitry adds to the cost of the system, takes up a large amount of space, typically requires calibration, and is subject to drift.

What is needed, therefore, is a pulse generator that provides accurate, low jitter edge placement with improved resolution at low cost, that would not require calibration and would be of simple and cost effective design.

SUMMARY

In an example embodiment, a pulse generator includes a phase accumulator that outputs a phase signal indicative of phase increments accumulated during each clock cycle of a clock signal; a pulse calculator that generates an intermediate pulse signal having pulses with leading and trailing edges aligned with edges of the clock signal and that generates a delay signal, the intermediate pulse signal and the delay signal being generated responsive to the phase signal, a pulse width signal identifying a desired pulse width and a repetition signal identifying a desired period of repetition; and a fractional delay filter that delays at least one of the leading edge and the trailing edge of at least one of the pulses of the intermediate pulse signal by a fraction of the clock cycle responsive to the delay signal, to provide a pulse waveform having the desired pulse width and the desired period of repetition.

The fractional delay filter may be a low pass filter having a plurality of impulse responses that are the same as each other and are provided with respective different delays that are each a fraction of the clock cycle, wherein respective ones of the impulse responses are provided as respective leading and trailing edges of the pulse waveform responsive to the delay signal.

In another example embodiment, a pulse generator includes a fractional delay filter having input thereto a clock signal, an intermediate pulse signal and a delay select signal, the clock signal having a clock cycle and the intermediate pulse signal having a plurality of pulses with leading and trailing edges aligned with edges of the clock signal, the fractional delay filter having a plurality of impulse responses that are the same as each other and that are each provided with respective different delays that are a fraction of the clock cycle, and having a plurality of filter coefficients stored therein that are selectable responsive to the delay signal to output respective ones of the impulse responses as respective leading and trailing edges of an output pulse waveform having a desired pulse width and a desired period of repetition.

In a still further example embodiment, a method of generating a pulse waveform includes accumulating phase increments of a clock signal during each clock cycle of the clock signal to provide a phase signal responsive thereto; generating a delay signal and an intermediate pulse signal having pulses with leading and trailing edges aligned with edges of the clock signal, responsive to the phase signal, a pulse width signal identifying a desired pulse width and a repetition signal identifying a desired period of repetition; and delaying at least one of the leading edge and the trailing edge of at least one of the pulses of the intermediate pulse signal by a fraction of the clock cycle in a fractional delay filter responsive to the delay signal, to provide the pulse waveform having the desired pulse width and the desired period of repetition.

BRIEF DESCRIPTION OF THE DRAWINGS

The example embodiments may be best understood from the following detailed description when read with the accompanying drawing figures. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as not to obscure the description of the example embodiments. Such methods and apparatuses are clearly within the scope of the present teachings.

Figure 1:
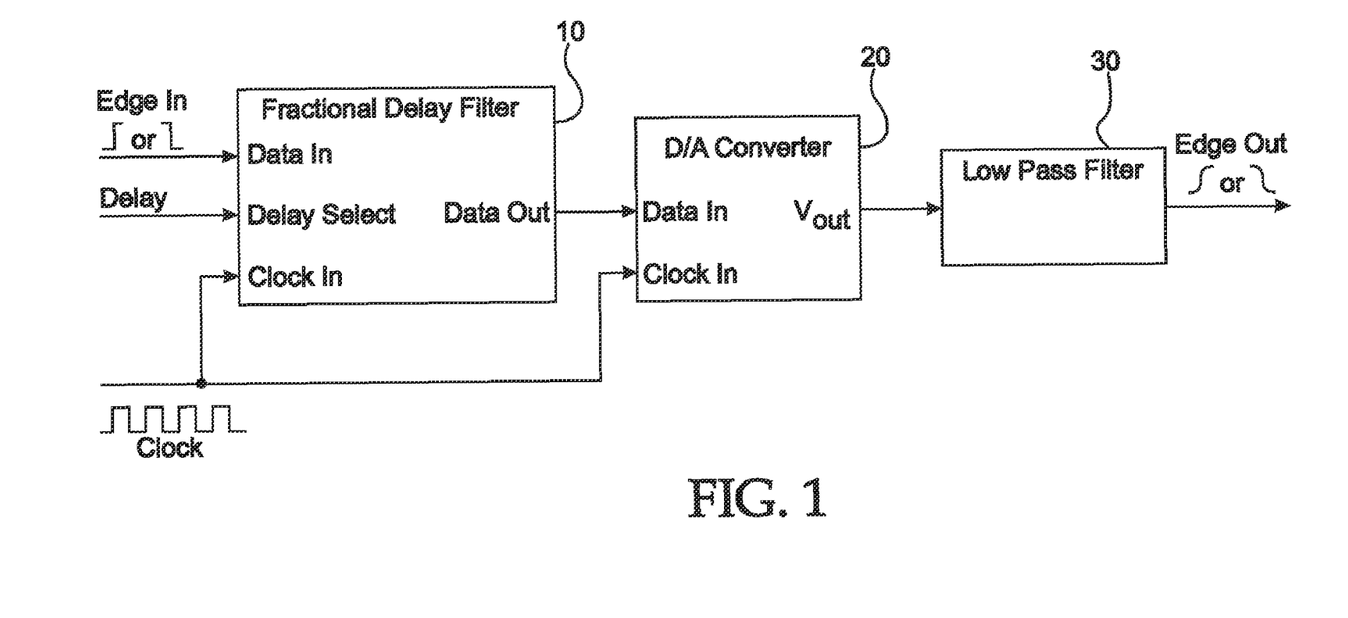
FIG. 1 is a block diagram of an example embodiment of part of a pulse generator, including a fractional delay filter that provides variable delay, a D/A converter, and a low pass filter.

FIG. 1 illustrates a block diagram of an example embodiment of part of a pulse generator 1, including a fractional delay filter (FDF) 10 that provides variable delay, a D/A converter 20 and a low pass filter 30. The fractional delay filter 10 in this example embodiment may be a low-pass digital filter, with either a finite impulse response (FIR) or an infinite impulse response (IIR). Fractional delay filter 10 differs from ordinary digital filters in having the ability to apply the impulse response function to its input data with a number of selectable time delays. That is, fractional delay filter 10 has a plurality of impulse responses that have the same shape with respect to each other, but that however have different respective delays and that may thus be provided as outputs for the respective leading and/or trailing edges of the input data. The respective different delays are each a fraction of the clock cycle. Incidentally, it should be appreciated that the impulse response function of fractional delay filter 10 can be determined by any appropriate filter design method as would be understood by one of ordinary skill, as long as the impulse responses have the same shape and have different respective delays. An example embodiment of fractional delay filter 10 will be subsequently described with respect to FIG. 2.

As shown in FIG. 1, fractional delay filter 10 has as an input to a Clock In terminal a clock signal which in one embodiment has a clock frequency of about 250 MHz. It should be understood however that the clock signal should not be limited to 250 MHz, but can be any frequency. The clock signal may be provided by a conventional crystal-controlled clock as having accurately occurring cycles substantially without jitter. The Data In input terminal has input thereto a pulse waveform having a plurality of pulses, each of the pulses having a respective leading edge and a respective trailing edge. In particular, the leading and trailing edges of the pulse waveform provided to the Data In terminal are aligned with the clock edges of the clock signal, and may be provided by conventional digital pulse generators of the type described above. As further shown, a delay signal is provided to the Delay Select terminal of fractional delay filter 10.

Figure 2:
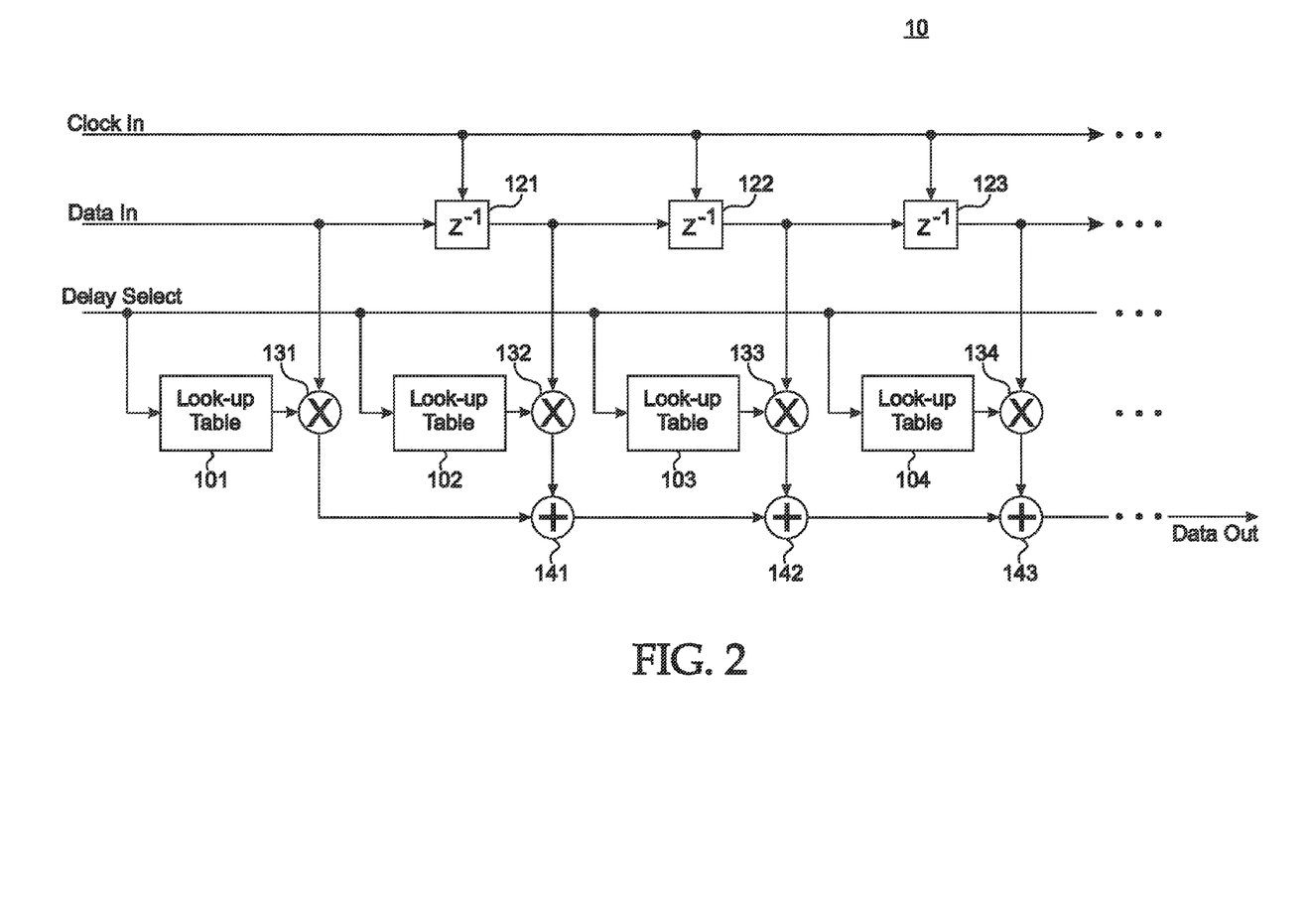
FIG. 2 is a block diagram of an example embodiment of a finite impulse response filter that may be used as the fractional delay filter of FIG. 1.

Turning to FIG. 2, an example embodiment of an FIR filter that may be used as fractional delay filter 10 is described in detail. As shown in FIG. 2, the delay signal is provided via the Delay Select terminal to a plurality of look-up tables 101, 102, 103, 104, . . . 10n. The look-up tables each store a plurality of filter coefficients that are selectably output responsive to the delay signal to a plurality of respective multipliers 131, 132, 133, 134, . . . 13n. The FIR filter further includes a plurality of delay elements 121, 122, 123, . . . 12n, which each provide a delay of one clock cycle and which are clocked by the clock signal provided via the Clock In terminal. The input pulse waveform is provided via the Data In terminal to multiplier 131 and delay element 121. The outputs of delay elements 121, 122, and 123 are respectively provided to multipliers 132, 133 and 134. The outputs of multipliers 131 and 132 are provided to adder 141. The outputs of adder 141 and multiplier 133 are provided to adder 142. Also, the outputs of adder 142 and multiplier 134 are provided to adder 143, which provides an output pulse waveform via the Data Out terminal.

The FIR filter in FIG. 2 implemented as a fractional delay filter enables respective selection of one of the plurality of impulse responses each having the same shape but different group delay for each respective leading and trailing edge of the input pulse waveform, to provide the output pulse waveform having leading and trailing edges delayed by fractions of the clock cycle. That is, successive edges of the input pulse waveform may be delayed by different fractional amounts of the clock cycle to provide the output pulse waveform having desired pulse width and desired period of repetition. For example, each look-up table 101, 102, 103, 104, . . . 10n may have 256 coefficients. In the alternative, the look-up tables may store 128 coefficients, and interpolation between look-up table entries may be used to increase the number of selectable coefficients for each look-up table to provide 256 selectable coefficients. So for example, depending on the value of the delay select signal, 256 different possible sets of coefficients may be provided to multipliers 131, 132, 133, 134, . . . 13n, so that respective ones of the impulse responses may be provided as the output pulse waveform from the FIR filter for each particular respective leading or trailing edge of the input pulse waveform. It should be understood that in some embodiments, more or less than 256 selectable coefficients may be employed. Incidentally, if the input pulse waveform is only 1 bit wide, each of multipliers 131, 132, 133, 134, . . . 13n simplifies to a multiplexer that provides an output switching between 0 and the value from the corresponding look-up table.

It should also be understood that for interpolation, the number of selectable delays may be increased by more than a factor of two. For example, a 250-MHz clock having a period of 4 nanoseconds and having 4096 selectable delays would provide edge-placement resolution of less than 1 picosecond. The 4096 selectable delays can be achieved in a number of ways. For example, a look-up table having 256 entries could be interpolated by a factor of 16, a look-up table having 128 entries could be interpolated by 32, a look-up table having 64 entries could be interpolated by 64, etc. However, although reducing look-up table size saves hardware, accuracy suffers as interpolation is increased, consequently leading to increased jitter.

Returning to FIG. 1, the output pulse waveform provided from the Data Out terminal of the fractional delay filter 10 as having desired pulse width and desired period of repetition is a digital signal that is subsequently provided to digital/analog converter 20, which also has the clock signal input thereto at the Clock In terminal. Digital/Analog converter 20 converts the output pulse waveform as provided from fractional delay filter 10 to an output voltage via the $V_{out}$ terminal. Analog anti-aliasing low pass filter 30 may be subsequently included, to smooth the step-like output voltage from digital/analog converter 20 into a desired waveform. The response of the low pass filter 30 is chosen such that when combined with the response of the fractional delay filter 10, the overall response meets the requirements for the pulse waveform. Normally, it is desired to minimize overshoot and ringing while maximizing stop-band rejection. Since this is a sampled-data system, there will be images in the spectrum of the output of digital/analog converter 20 that will cause jitter unless attenuated sufficiently by low pass filter 30. The resulting output from low pass filter 30 is an overall response that has a desired pulse width and desired period of repetition.

Figure 3:
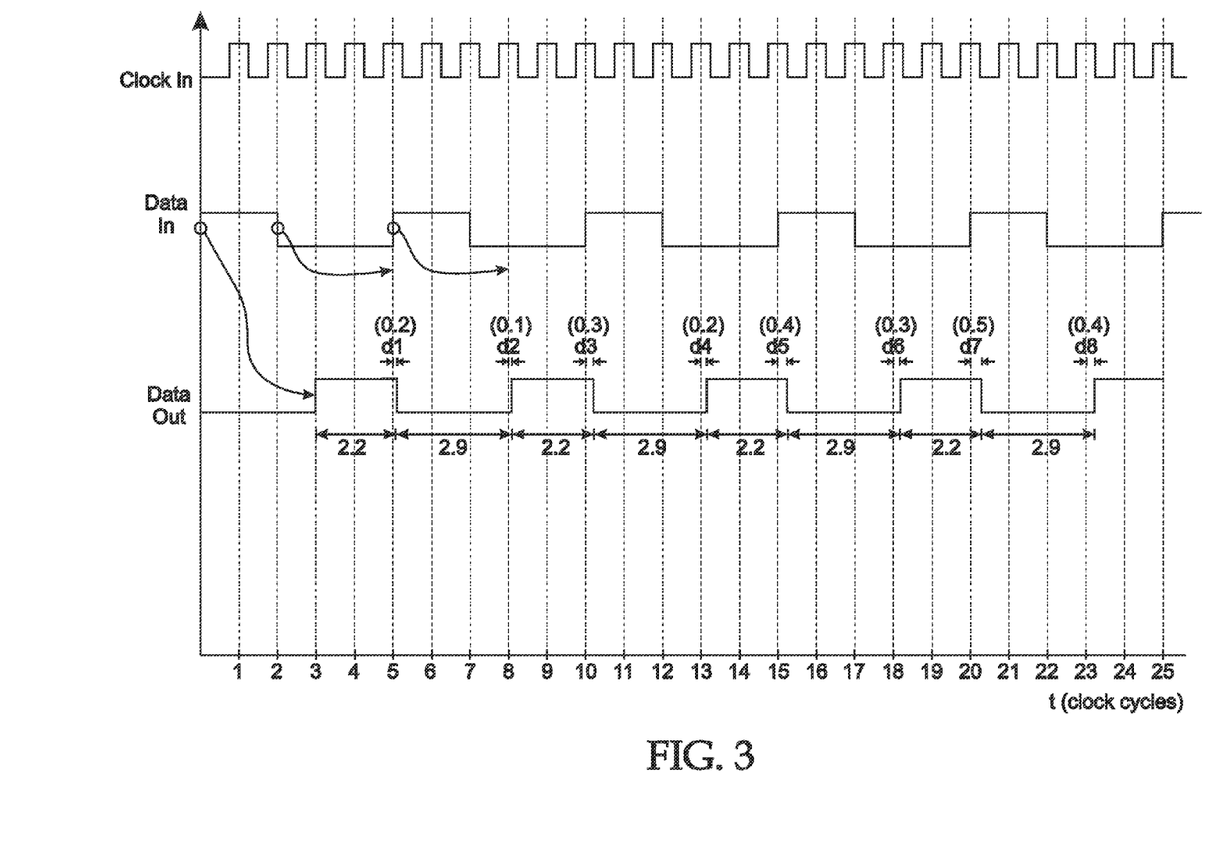
FIG. 3 is a timing chart for explanation of the finite impulse response filter of FIG. 2.

FIG. 3 is a timing chart for explanation of how the FIR filter of FIG. 2 used as fractional delay filter 10 operates to delay successive edges of the input pulse waveform by various different amounts of delay to provide the output pulse waveform having a desired pulse width and a desired period of repetition. FIG. 3 shows the clock signal, input pulse waveform and the output pulse waveform as respectively provided at the Clock In, Data In and Data Out terminals, wherein the horizontal axis indicates time in terms of the number of clock cycles.

It should be understood that even when set to provide 0 delay to an input leading or trailing edge, the FIR filter has inherent delay because of the various adders, multipliers and delay components 121, 122, 123, . . . 12n shown in FIG. 2. The example described with respect to FIG. 3 assumes the FIR filter as having an inherent delay of three clock cycles. As may be appreciated in view of FIG. 3, the very first leading edge of the input pulse waveform as provided to the FIR filter at time t=0 is assumed as provided through the FIR filter without delay as responsive to the delay signal input thereto, and therefore is provided as the leading edge of the output pulse waveform at time t=3 in view of the assumed 3 clock cycle delay inherent in the FIR filter. That is, each respective leading edge and trailing edge of the input pulse waveform in FIG. 3 would be provided as a respective leading and trailing edge of the output pulse waveform with inherent delay of three clock cycles if the FIR filter applied no selected delay. The resulting output pulse waveform in such an instance would be a replica of the input pulse waveform merely shifted three clock cycles. It should however also be understood that the inherent delay is arbitrarily chosen in this instance as 3 clock cycles only for the sake of explanation, and may be different depending on the number of stages and/or the structure of the FIR filter.

In the example described with respect to FIG. 3, it is assumed that the output pulse waveform is to be provided as having a desired pulse width of 2.2 clock cycles and a desired period of repetition of 5.1 cycles. These values of desired pulse width and desired period of repetition are only for purposes of explanation, and should not in any way be construed as limiting. Since the input pulse waveform as provided to fractional delay filter 10 is provided as having leading and trailing edges which are necessarily aligned with clock edges, the pulse width of the input pulse waveform is 2.0 clock cycles and the period of repetition is 5.0 clock cycles. The leading edge of the input pulse waveform at time t=0 as noted above is provided as the leading edge of the output pulse waveform through the FIR filter as having 0 selected delay, and is therefore provided at time t=3 in view of the inherent delay of the FIR filter. The first trailing edge of the input pulse waveform is subsequently provided as an impulse response delayed by 3 clock cycles because of the inherent delay, and by 0.2 clock cycles responsive to the delay signal, to provide the first trailing edge of the output pulse waveform at 5.2 clock cycles. That is, the first trailing edge of the output pulse waveform is selectively delayed d1=0.2 clock cycles from when it would have otherwise been provided at t=5.0 clock cycles due to the inherent delay of the FIR filter. To provide a desired period of repetition of 5.1 clock cycles, the second leading edge of the input pulse waveform is provided as an impulse response to be the second leading edge of the output pulse waveform 2.9 clock cycles after the first trailing edge of the output pulse waveform at t=8.1 clock cycles, that is delayed d2=0.1 clock cycles from when it would have been provided at t=8.0 clock cycles due to the inherent delay.

Subsequently, the second trailing edge of the input pulse waveform is provided as an impulse response as the second trailing edge of the output pulse waveform 2.2 clock cycles after the second leading edge of the output pulse waveform, at t=10.3 clock cycles delayed d3=0.3 clock cycles from when it would have otherwise been provided, to maintain the desired pulse width of 2.2 clock cycles. The third leading edge of the input pulse waveform is provided as an impulse response as the third leading edge of the output pulse waveform 2.9 clock cycles after the second trailing edge of the output pulse waveform, at t=13.2 clock cycles delayed d4=0.2 clock cycles from when it would have otherwise been provided, to maintain the desired period of repetition at 5.1 clock cycles. The remaining subsequent trailing and leading edges of the input pulse waveform are provided as impulse responses corresponding to edges of the output pulse waveform with the shown delays d5 to d8 . . . , as should be readily understood.

Figure 4:
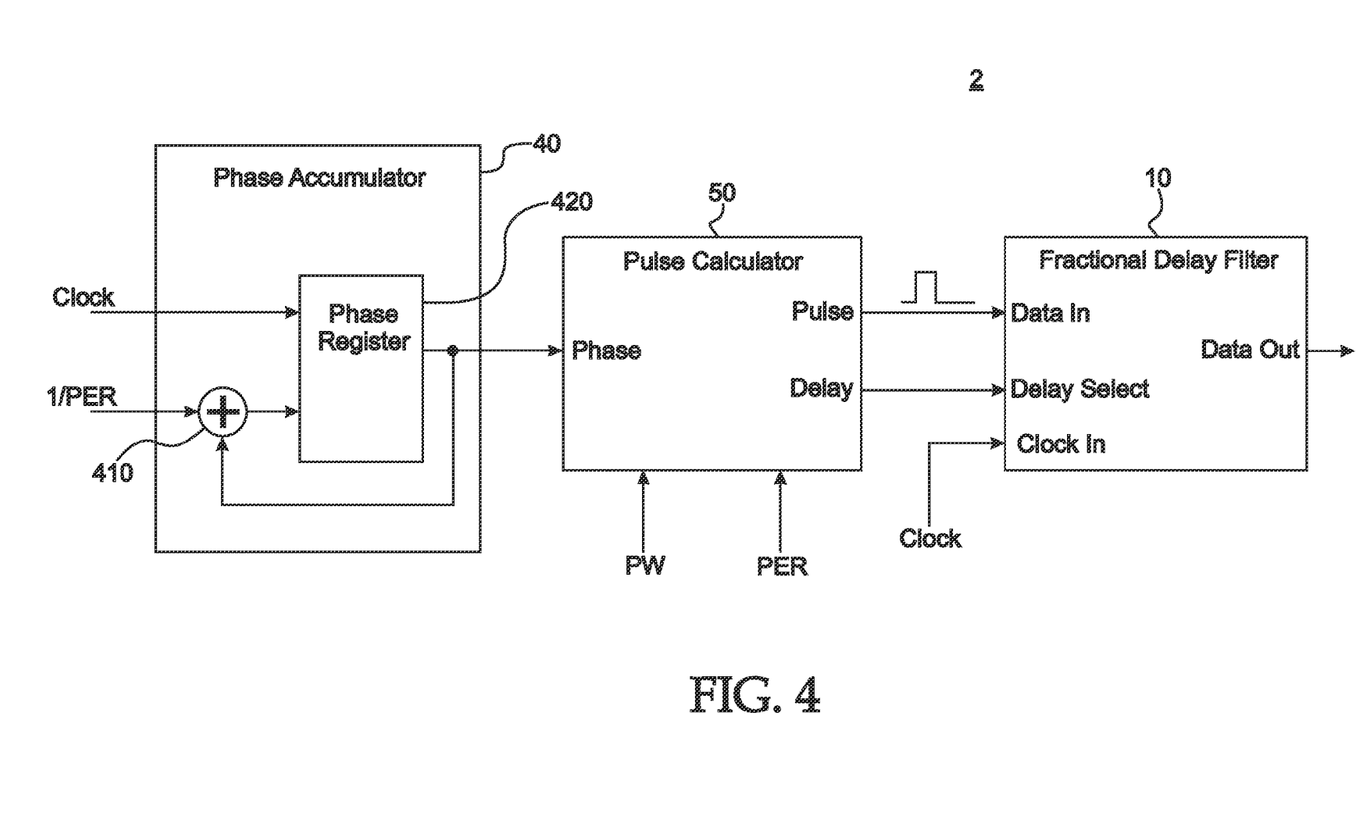
FIG. 4 is a block diagram of an example embodiment of part of a pulse generator including a phase accumulator, a pulse calculator and a fractional delay filter.

FIG. 4 is a block diagram of an example embodiment of part of a pulse generator 2 including fractional delay filter 10 such as described with respect to FIGS. 1-3 for example, and also including digital circuitry to create the leading and trailing edges of the input pulse waveform that are aligned with edges of the clock signal. The additional circuitry includes phase accumulator 40 and pulse calculator 50. The output pulse waveform as provided from fractional delay filter 10 may be provided to a digital/analog converter and an anti-aliasing filter such as described with respect to FIG. 1 for example.

Phase accumulator 40 in FIG. 4 includes phase register 420 and adder 410. A phase increment value 1/PER (inverse of the desired period of repetition) is provided to adder 410. Although not specifically shown in FIG. 4, phase increment value 1/PER may be stored in a register in phase accumulator 40 to be provided to adder 410. The clock signal and the output of the adder 410 are provided to phase register 420. Phase register 420 holds an instantaneous phase value, which is output as a phase signal to the Phase terminal of pulse calculator 50 as shown and which is also fed back to adder 410. The desired period of repetition PER, and the desired pulse width PW as a fraction of the desired period of repetition PER, are both input to pulse calculator 50. Pulse calculator 50 generates and outputs to fractional delay filter 10 the delay signal via the Delay terminal and a pulse waveform via the Pulse terminal as the input pulse waveform having leading and trailing edges aligned with edges of the clock signal.

In detail, at each clock of the clock signal, phase accumulator 40 adds the phase increment value 1/PER to the phase signal output from phase register 420. The phase signal thus represents the phase of the waveform as a fraction of a cycle. Overflows in the addition mark the end of one period and the beginning of a next period. Pulse calculator 50 functions such that when the phase value crosses zero, pulse calculator 50 asserts the pulse waveform at the Pulse terminal to create a leading edge of the input pulse waveform provided to fractional delay filter 10. Pulse calculator 50 simultaneously sets the value of the delay signal provided via the Delay terminal to fractional delay filter 10 as follows:

$$\text{Delay} = 1 - \text{Phase} * \text{PER} \quad (1).$$

When the phase value exceeds the desired pulse width PW, pulse calculator 50 negates the pulse waveform at the Pulse terminal to create a trailing edge of the input pulse waveform provided to fractional delay filter 10. Pulse calculator 50 simultaneously sets the value of the delay signal provided via the Delay terminal to fractional delay filter 10 as follows:

$$\text{Delay} = 1 - (\text{Phase} - \text{PW}) * \text{PER} \quad (2).$$

Pulse calculator 50 can be configured as including multipliers, adders and subtractors as should be understood by one of ordinary skill. In the alternative, the functionality of pulse calculator 50 may be provided by a processor executing a software algorithm, or a combination of hardware and a software-driven processor.

Accordingly, in the pulse generator of the example embodiment described with respect to FIG. 4, phase is treated as a fraction of a waveform cycle. At each clock edge, the phase increment value 1/PER is added to the phase and stored in phase register 420. The phase value therefore increases linearly until addition overflows, at which point a new cycle begins. The average frequency of overflows, and therefore the frequency of the output, is proportional to the phase increment value 1/PER. The advantage of a phase accumulator as in this example embodiment over a counter-based approach of the conventional analog/digital hybrid pulse generators is that the number of bits of the phase increment and the number of bits in the phase registers can be made arbitrarily high, leading to arbitrarily fine frequency resolution. Also, the control parameter in this example embodiment is frequency, not period as in counter-based conventional analog/digital hybrid pulse generators, thus making frequency modulation (FM) and frequency sweep easier to implement.

In the pulse generator of the example embodiment described with respect to FIG. 4, the desired pulse width PW is selected as a fraction of the desired period of repetition PER, so that the pulse width of the pulse waveform output from the fractional delay filter as the output pulse waveform is a constant fraction of the period of repetition. If the desired period of repetition of the output pulse waveform (or the frequency thereof) was to be changed, the pulse width would tend to scale at a fraction of that change. That is, if for example an output pulse waveform having pulse width 35% of the period of repetition is desired, the 35% pulse width would be constant if the desired period of repetition was changed. However, in some applications it may be desirable to maintain a constant pulse width as the desired period of repetition of the output pulse waveform is changed.

Figure 5:
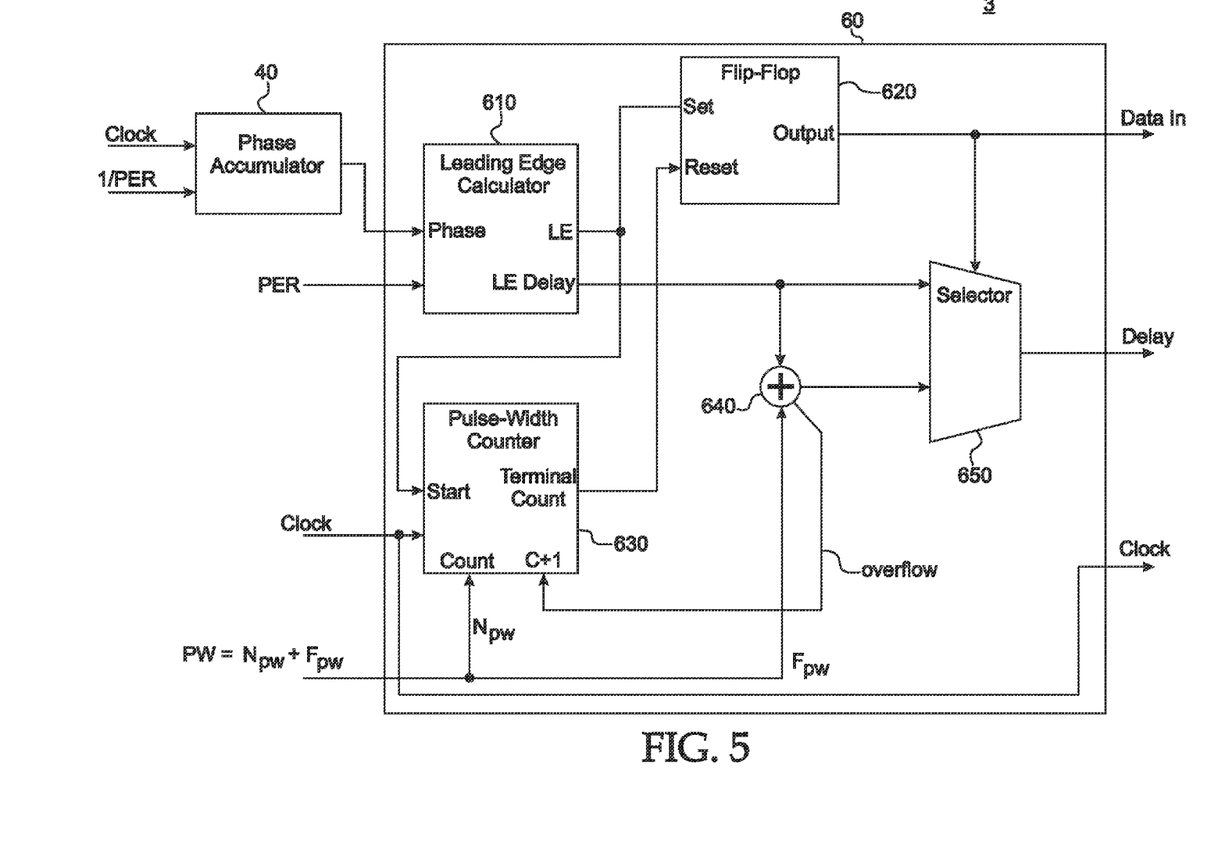
FIG. 5 is a block diagram of an example embodiment of part of a constant pulse-width pulse generator including a phase accumulator and a pulse calculator.

FIG. 5 is a block diagram of an example embodiment of part of a constant pulse-width pulse generator 3, which includes pulse calculator 60, phase accumulator 40 as described with respect to FIG. 4, and a fractional delay filter (not shown) such as described with respect to FIGS. 1-3 for example. Pulse calculator 60 outputs to the fractional delay filter (not shown) a delay signal and the input pulse waveform having leading and trailing edges aligned with the clock signal. A digital/analog converter and an anti-aliasing filter as described with respect to FIG. 1 may follow the fractional delay filter. Description of phase accumulator 40, the fractional delay filter, the digital/analog converter and the anti-aliasing filter which may be used in connection with the constant pulse-width pulse generator of FIG. 5 is here omitted for the sake of brevity.

In detail, pulse calculator 60 in FIG. 5 includes a leading-edge calculator 610 that has input thereto at the Phase terminal the phase signal provided from phase register 42 of phase accumulator 40 and the desired period of repetition PER. Leading edge calculator 610 functions somewhat similarly as pulse calculator 50, such that when the phase value as indicated by the phase signal output from phase accumulator 40 crosses 0, leading edge calculator 610 asserts the signal at the LE terminal, whereby the leading edge signal is provided to set flip-flop 620 to thus create the leading edge of the input pulse waveform as provided to the fractional delay filter. The leading edge signal is also provided to the start terminal of pulse-width counter 630 which starts counting clock cycles upon receipt of the leading edge signal. Simultaneously with providing the leading edge signal, leading-edge calculator 610 sets the value of the leading edge delay signal provided at the LE Delay terminal as follows:

$$LE\ Delay = 1 - Phase * PER \quad (3).$$

The leading edge delay signal is provided as output from leading-edge calculator 610 to adder 640 and selector 650. It should be understood that leading edge calculator 610 may be configured as including multipliers, adders and subtractors as would be understood by one of ordinary skill, or the functionality of pulse calculator 60 may be provided by a processor executing a software algorithm, or a combination of hardware and a software-driven processor.

In contrast to the pulse generator of the example embodiment described with respect to FIG. 4, desired pulse width PW is set as a number of clock cycles rather than as a fraction of the desired period of repetition PER. The desired pulse width PW is thus input to pulse calculator 60 as:

$$PW = N_{PW} + F_{PW} \quad (4).$$

$N_{PW}$ is a signal having an integer value greater than 0, and represents the desired pulse width in terms of whole or integer numbers of clock cycles. $F_{PW}$ is a signal having a fractional value greater than or equal to 0 and less than 1, and represents the desired pulse width as a fraction of a clock cycle. As shown in FIG. 5, the $N_{PW}$ signal is provided to the count terminal of pulse width counter 630, and the $F_{PW}$ signal is provided to adder 640.

As further shown in FIG. 5, pulse width counter 630 also has as input thereto the clock signal and an overflow signal provided from adder 640 to the C+1 terminal. Pulse-width counter 630 provides a terminal count signal to reset flip-flop 620 via the Terminal Count terminal, to generate the trailing edge of the input pulse waveform provided to the fractional delay filter.

The constant pulse-width pulse generator described with respect to FIG. 5 operates such that at each clock cycle, phase accumulator 40 adds the phase increment value 1/PER to the phase signal output from phase register 42 (shown in FIG. 4), whereby the phase signal represents the phase value of the waveform as a fraction of a cycle. Overflows in the addition mark the end of one period and the beginning of the next period. When the phase value crosses zero, leading edge calculator 610 asserts the leading edge signal provided via the LE terminal, thereby setting flip-flop 620 to create the leading edge of the input pulse waveform provided to the fractional delay filter. Pulse-width counter 630 starts counting clock cycles upon receipt of the leading edge signal. As described previously, also at that time, leading edge calculator 610 simultaneously sets the leading edge delay signal, which is the amount of delay of the leading edge necessary in view of the desired period of repetition and which is output to adder 640 and selector 650. Selector 650 selects and passes the leading edge delay signal to the fractional delay filter as the delay signal for the leading edge of the input pulse waveform. Pulse-width counter 630 normally asserts the terminal count signal $N_{PW}$ clock cycles after being started, thereby resetting flip-flop 620 to create the trailing edge of the input pulse waveform. At this time, adder 640 adds the leading edge delay signal and the $F_{PW}$ signal, to provide trailing edge delay signal to selector 650 as the amount of delay of the trailing edge necessary in view of the desired pulse width. Selector 650 then passes the trailing edge delay signal to the fractional delay filter as the delay signal for the trailing edge of the input pulse waveform. Upon the occurrence of overflow in the trailing edge calculation performed by adder 640, which would be indicative of a delay greater than 1 clock cycle, an overflow signal is provided from adder 640 to the C+1 terminal of pulse-width counter 630. The overflow causes pulse-width counter 630 to count ($N_{PW}$+1) clock cycles instead of $N_{PW}$ cycles. In this manner, the desired pulse width of the pulse waveform provided by the fractional delay filter can be maintained as a constant number of clock cycles while the desired period of repetition is changed.

Figure 6:
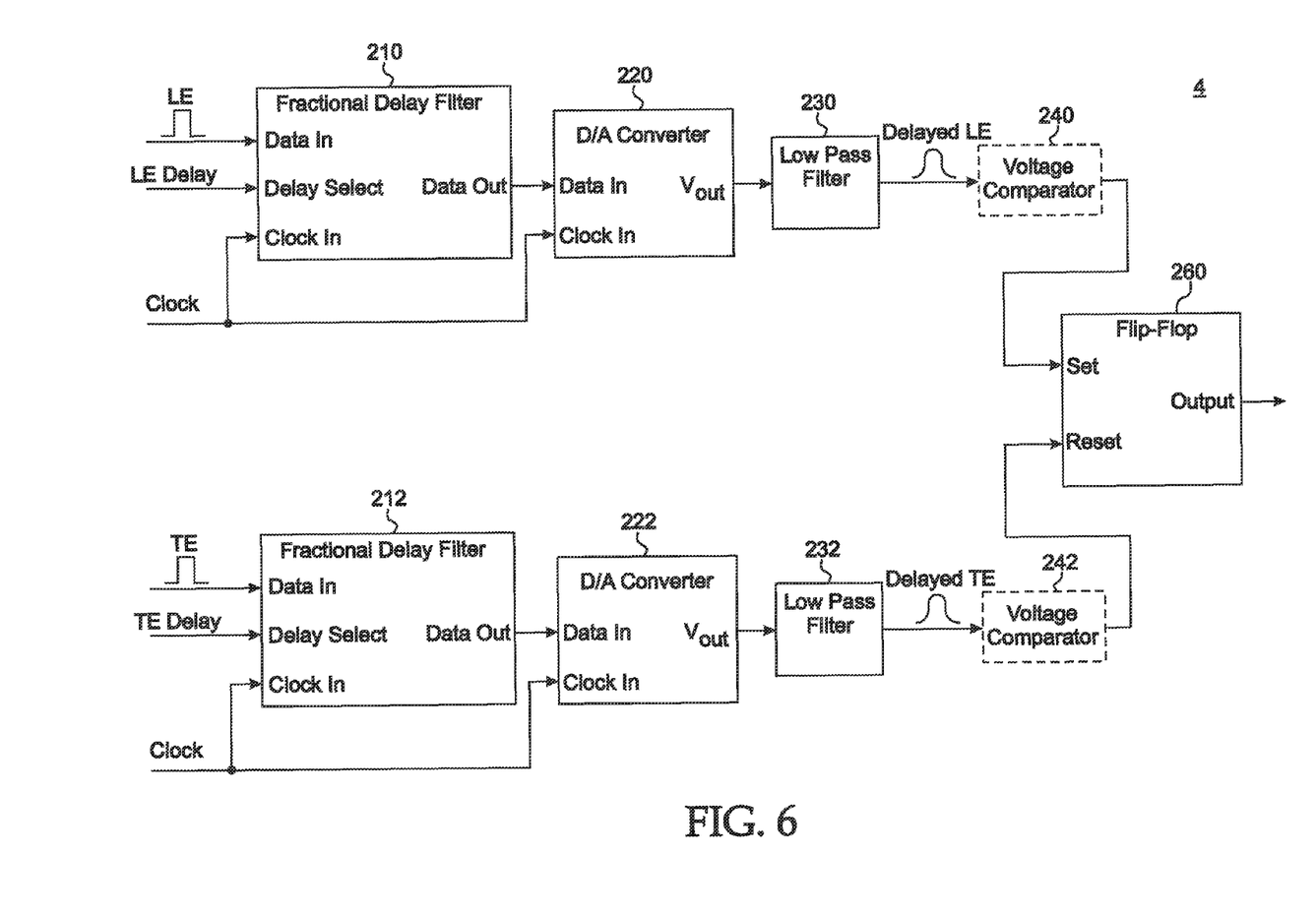
FIG. 6 is a block diagram of an example embodiment of part of a pulse generator that includes a pair of fractional delay filters that respectively delay the leading and trailing edges separately.

FIG. 6 is a block diagram of an example embodiment of part of a pulse generator 4 that includes fractional delay filters 210 and 212 that respectively delay the leading edges and the trailing edges of input data separately. As shown in FIG. 6, fractional delay filter 210 has a leading edge LE signal that is aligned with edges of the clock signal provided to the Data In terminal, a leading edge delay signal provided to the Delay Select terminal, and a clock signal provided to the Clock In terminal. In a somewhat similar manner, fractional delay filter 212 has a trailing edge TE signal that is aligned with edges of the clock signal provided to the Data In terminal, a trailing edge delay signal provided to the Delay Select terminal, and the clock signal provided to the Clock In terminal. The leading edge LE signal and the trailing edge TE signal respectively correspond to the leading and trailing edges of an input pulse waveform, and may be provided as from a same clock cycle.

Fractional delay filter 210 in FIG. 6 has a plurality of impulse responses that have the same shape with respect to each other, but that have different respective delays and that are selectively provided as outputs corresponding to the respective leading edges of the input pulse waveform responsive to the leading edge delay signal. Likewise, fractional delay filter 212 has a plurality of impulse responses that have the same shape with respect to each other, but that have different respective delays and that are selectively provided as outputs corresponding to the respective trailing edges of the input pulse waveform responsive to the trailing edge delay signal. The respective delays are each a fraction of the clock cycle. The output pulse waveform provided from the Data Out terminal of fractional delay filter 210 thus has pulses that correspond to the leading edges of the input pulse waveform but that are however placed precisely within fractions of the clock cycle. Likewise, the output pulse waveform provided from the Data Out terminal of fractional delay filter 212 has pulses that correspond to the trailing edges of the input pulse waveform but that are however placed precisely within fractions of the clock cycle.

As further shown in FIG. 6, the output pulse waveforms of fractional delay filters 210 and 212 are respectively provided to the Data In terminals of digital/analog converters 220 and 222, which convert the output pulse waveforms to respective output voltages that are subsequently provided via the $V_{OUT}$ terminals to respective low pass filters 230 and 232. Low pass filters 230 and 232 smooth the step-like output voltages from digital/analog converters 220 and 222 into respective desired waveforms indicated as the Delayed LE signal and the Delayed TE signal. Digital/analog converters 220 and 222, and low pass filters 230 and 232 function similarly to digital/analog converter 20 and low pass filter 30 as described with respect to FIG. 1. As also shown in FIG. 6, pulse generator 4 includes optional voltage comparators 240 and 242 indicated by dotted line, which may be used if necessary or desired to respectively convert the analog levels of the Delayed LE signal and the Delayed TE signal provided from low pass filters 230 and 232.

Flip-flop 260 as shown in FIG. 6 is set by the Delayed LE signal as provided to the set terminal via voltage comparator 240, or as provided directly from low pass filter 230. Flip-flop 260 is reset by the Delayed TE signal as provided to the reset terminal via voltage comparator 242, or as provided directly from low pass filter 232. Flip-flop 260 thus provides the resulting output via the Output terminal as an overall response that has a desired pulse width and a desired period of repetition.

Figure 7:
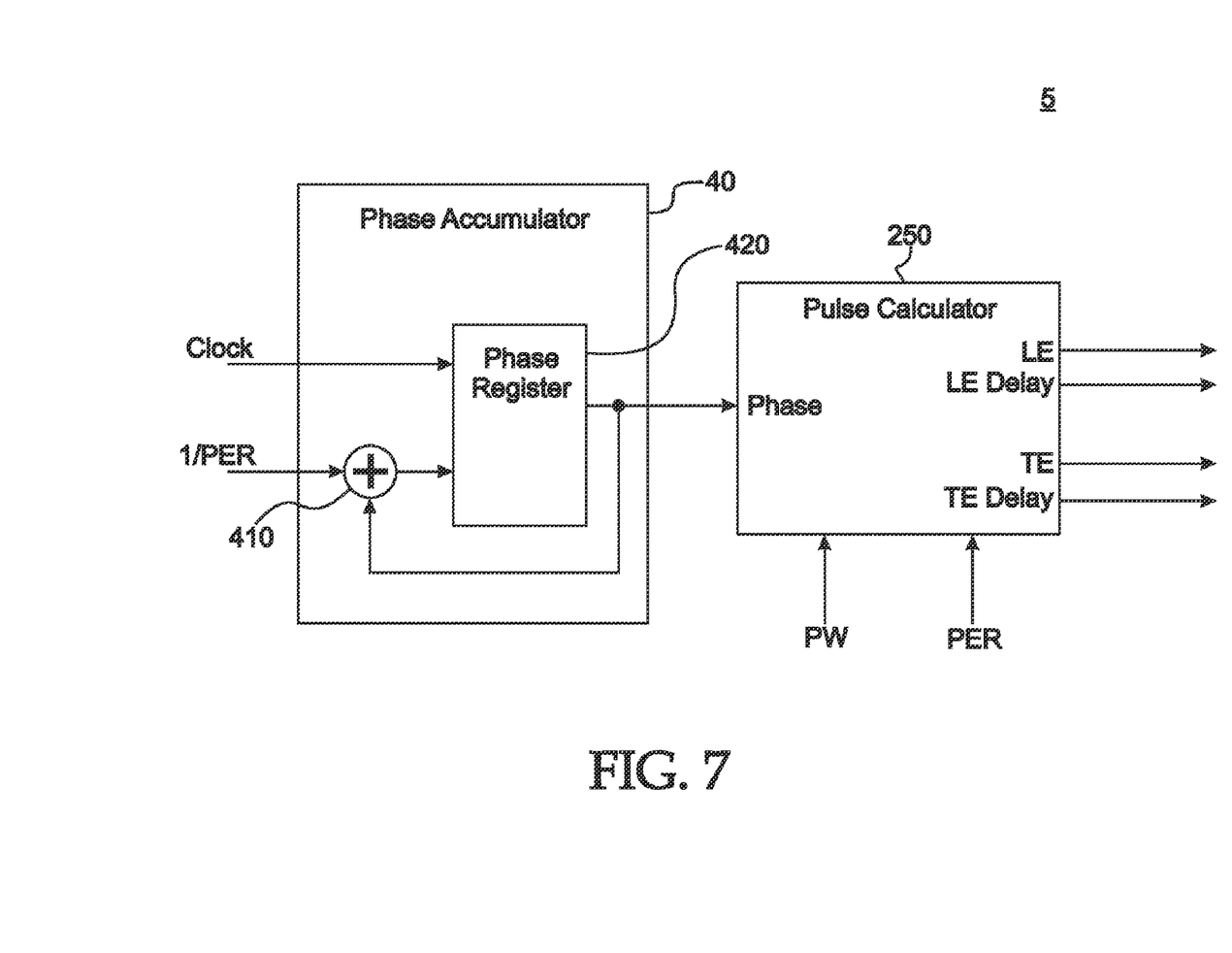
FIG. 7 is a block diagram of an example embodiment of part of a pulse generator including a phase accumulator and a pulse calculator that may be used in connection with the fractional delay filters of FIG. 6.

FIG. 7 is a block diagram of an example embodiment of part of a pulse generator 5 including a phase accumulator 40 and a phase calculator 250 that may be used in connection with the embodiment of FIG. 6. Phase accumulator 40 shown in FIG. 7 includes phase register 420 and adder 410, and is similar in structure and functionality as phase accumulator 40 described previously with respect to FIG. 4. Further description of phase accumulator 40 is omitted here for the sake of brevity.

Phase accumulator 40 in FIG. 7 provides an instantaneous phase value to the Phase terminal of pulse calculator 250. The desired period of repetition PER, and the desired pulse width PW as a fraction of the desired period of repetition PER are both input to pulse calculator 250. Pulse calculator 250 generates and outputs the leading edge LE signal and the leading edge delay signal to fractional delay filter 210 shown in FIG. 6 for example. Pulse calculator 250 also generates the trailing edge TE signal and the trailing edge delay signal to fractional delay filter 212 shown in FIG. 6 for example. As described, the leading edge LE signal and the trailing edge TE signal are both aligned with edges of the clock signal.

In detail, at each clock of the clock signal, phase accumulator 40 adds the phase increment value 1/PER to the phase signal output from phase register 420. The phase signal thus represents the phase of the waveform as a fraction of the cycle. Overflows in the addition mark the end of one period and the beginning of a next period. Pulse calculator 250 functions such that when the phase value crosses zero, pulse calculator 250 asserts the leading edge LE signal corresponding to a leading edge of the input pulse waveform. Pulse calculator 250 simultaneously sets the value of the leading edge delay signal provided via the LE Delay terminal as follows:

$$\text{LE Delay} = 1 - \text{Phase} * \text{PER} \qquad (5).$$

When the phase value exceeds the desired pulse width PW, pulse calculator 250 asserts the trailing edge TE signal corresponding to a trailing edge of the input pulse waveform. Pulse calculator 250 simultaneously sets the value of the trailing edge delay signal provided via the TE Delay terminal as follows:

$$\text{TE Delay} = 1 - (\text{Phase} - \text{PW}) * \text{PER} \qquad (6).$$

The trailing edges of both the leading edge delay signal and the trailing edge delay signal occur about ½ clock cycle subsequent the leading edges, responsive to accumulated phase as indicated by the phase signal output from phase register 420. Incidentally, the most significant bit of the phase signal may be sufficient to generate the leading edge LE signal. Similarly, the most significant bit of the phase signal may be sufficient to generate the trailing edge TE signal. Also, pulse calculator 250 may be configured as including multipliers, adders and subtractors as should be understood by one of ordinary skill. In the alternative, the functionality of pulse calculator 250 may be provided by a processor executing a software algorithm, or a combination of hardware and a software-driven processor.

Figure 8:
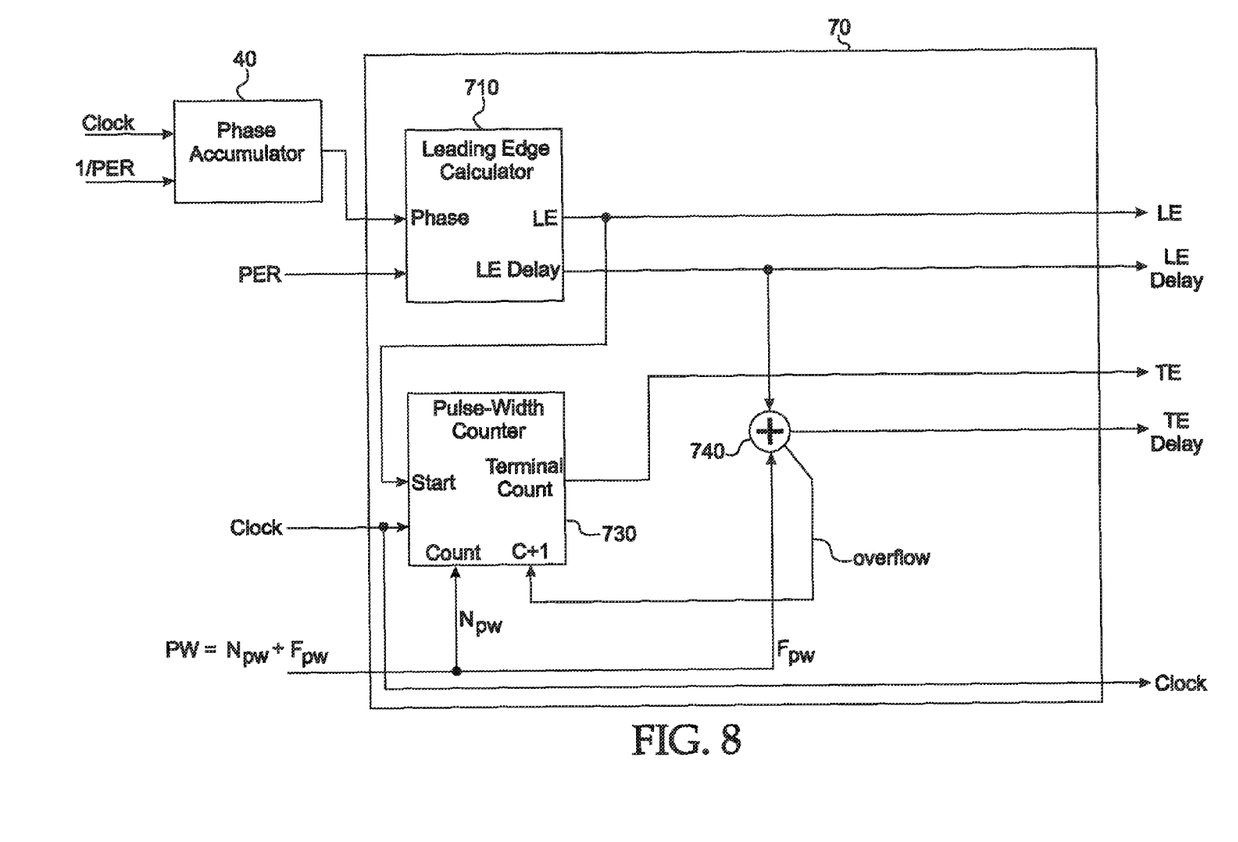
FIG. 8 is a block diagram of an example embodiment of part of a two-path constant pulse-width pulse generator including a phase accumulator and a pulse calculator.

FIG. 8 is a block diagram of an example embodiment of part of a two-path constant pulse-width pulse generator 6, which includes pulse calculator 70 and phase accumulator 40. Phase accumulator 40 shown in FIG. 8 is similar in structure and functionality as phase accumulator 40 described with respect to FIG. 7. Further description of phase accumulator 40 is thus omitted here for the sake of brevity. Also, the two-path constant pulse-width pulse generator 6 shown in FIG. 8 may be used in connection with fractional delay filters 210 and 212 and the remaining circuitry as described with respect to FIG. 6.

In detail, pulse calculator 70 in FIG. 8 includes leading edge calculator 710 that has input thereto at the Phase terminal the phase signal provided from phase register 42 of phase accumulator 40 and the desired period of repetition PER. Leading edge calculator 710 functions somewhat similarly as pulse calculator 250 shown in FIG. 7, such that when the phase value as indicated by the phase signal output from phase accumulator 40 crosses zero, leading edge calculator 710 asserts the leading edge LE signal corresponding to a leading edge of the input pulse waveform, which may be provided to fractional delay filter 210 as shown in FIG. 6 for example. Leading edge calculator 710 simultaneously sets the value of the leading edge delay signal provided via the LE delay terminal in accordance with equation (5). The leading edge delay signal is provided to adder 740 and may also be provided to fractional delay filter 210 as shown in FIG. 6 for example. Pulse width counter 730 starts counting clock cycles upon receipt of the leading edge LE signal. Pulse width counter 730 normally asserts the terminal count signal $N_{PW}$ clock cycles after being started, thereby asserting the trailing edge TE signal which may be provided to fractional delay filter 212 as shown in FIG. 6 for example. At this time, adder 740 adds the leading edge delay signal and the $F_{PW}$ signal, to output the trailing edge delay signal, which may be provided to fractional delay filter 212 as shown in FIG. 6 for example. Upon occurrence of overflow in the trailing edge calculation performed by adder 740, which would be indicative of a delay greater than one clock cycle, an overflow signal is provided from adder 740 to the C+1 terminal of pulse-width counter 730. The overflow causes pulse-width counter 730 to count ($N_{PW}$+1) clock cycles instead of $N_{PW}$ cycles. In this manner, the desired pulse width of a pulse waveform may be provided from a pulse generator having fractional delay filters in two paths. The desired pulse width can be maintained as a constant number of clock cycles while the desired period of repetition is changed. That is, in the two-path constant pulse-width pulse generator as described with respect to FIG. 8, pulse width remains constant as the period of repetition is varied. It should be understood that similarly as described with respect to FIG. 5, the desired pulse width PW of the two-path constant pulse-width pulse generator of FIG. 8 is set as a number of clock cycles rather than as a fraction of the desired period of repetition PER. The desired pulse-width PW is thus input to pulse calculator 70 in accordance with equation (4). Thus, $N_{PW}$ is a signal having an integer value greater than or equal to zero and represents the desired pulse width in terms of whole or integer numbers of clock cycles, and $F_{PW}$ is a signal having a fractional value greater than or equal to zero and less than 1 and represents the desired pulse width as a fraction of a clock cycle. As shown in FIG. 8, the $N_{PW}$ signal is provided to the count terminal of pulse width counter 730 and the $F_{PW}$ signal is provided to adder 740.

In accordance with the above example embodiments, it should be understood that the fractional delay filter of the pulse generators may have an arbitrarily large number N of delayed step responses, and that edge-placement resolution of the pulse waveform output from the fractional delay filter is equal to the period of the clock signal divided by N. In an embodiment wherein N is $2^{16}$ or 65,536 delayed step responses and the clock period is about 6.5 nanoseconds, edge-placement resolution would be about 0.1 picosecond. It should however be understood that the above noted values of delayed step responses and clock period are merely exemplary and should not be construed as limiting, and that it would be straightforward in view of the teachings provided to achieve finer edge-placement resolutions.

Moreover, system performance of the above described example embodiments can be further optimized by modifying the content of the look-up tables. A modest number of small look-up tables are necessary to determine the response of the fractional delay filter. The content of the look-up tables can thus be easily modified in different ways to realize trade offs between performance parameters such as jitter, edge-transition time, and minimum pulse width, for example. A single hardware design can thus be easily tailored for different applications by using different look-up tables.

Also, since edge placement in the above noted example embodiments is controlled by digital circuits and a crystal-controlled clock, calibration of the system other than that of the clock frequency is not needed. Moreover, the delay as provided by the pulse generators of the example embodiments, including the fractional part as generated by the fractional delay filter, can change nearly instantaneously. As a result, the pulse generators of the example embodiments are sufficiently agile to perform fast frequency sweeps, frequency modulation (FM) and pulse-width modulation (PWM) changes to the output. The pulse generators of the above described example embodiments also can be implemented using low-cost digital integrated circuits, most conveniently in systems that already include digital/analog converters and anti-aliasing filters.

The invention claimed is:

1. A pulse generator comprising:
   a phase accumulator that outputs a phase signal indicative of phase increments accumulated during each clock cycle of a clock signal;
   a pulse calculator that generates an intermediate pulse signal having pulses with leading and trailing edges aligned with edges of the clock signal and that generates a delay signal, the intermediate pulse signal and the delay signal being generated responsive to the phase signal, a pulse width signal identifying a desired pulse width and a repetition signal identifying a desired period of repetition; and
   a fractional delay filter that delays at least one of the leading edge and the trailing edge of at least one of the pulses of the intermediate pulse signal by a fraction of the clock cycle responsive to the delay signal, to provide a pulse waveform having the desired pulse width and the desired period of repetition.

2. The pulse generator of claim 1, wherein the pulse calculator comprises:
   a leading edge calculator that generates a first signal that sets occurrence of leading edges and a first delay signal that sets an amount of leading edge delay, responsive to the phase signal and the repetition signal;
   a counter that counts clock cycles of the clock signal upon receipt of the first signal, responsive to the pulse width signal and an overflow signal, to provide a pulse width control signal;
   a flip-flop that generates the intermediate pulse signal responsive to the first signal and the pulse width control signal;
   an adder that adds the first delay signal and the pulse width signal to provide the overflow signal and a second delay signal that sets an amount of trailing edge delay; and
   a selector that selectively provides the first delay signal and the second delay signal as the delay signal for each respective leading and trailing edge of the intermediate pulse signal.

3. The pulse generator of claim 2, wherein the repetition signal comprises a first component that is provided to the counter and that is an integer multiple of the clock cycle, and a second component that is provided to the adder and that is a fraction of the clock cycle less than one clock cycle.

4. The pulse generator of claim 1, wherein the fractional delay filter is a low pass filter having a plurality of impulse responses that are the same as each other and are provided with respective different delays that are each a fraction of the clock cycle, wherein respective ones of the impulse responses are provided as respective leading and trailing edges of the pulse waveform responsive to the delay signal.

5. The pulse generator of claim 1, wherein the fractional delay filter comprises a plurality of stored coefficients that are respectively selectable for each of leading and trailing edges of the pulse waveform responsive to the delay signal.

6. The pulse generator of claim 1, wherein edge placement resolution of the fractional delay filter is less than 1 picosecond.

7. The pulse generator of claim 1, wherein the fractional delay filter delays successive edges of the pulses of the intermediate pulse signal with different delays that are a fraction of the clock cycle responsive to the delay signal, to provide the pulse waveform.

8. The pulse generator of claim 1, further comprising:
a digital to analog converter that converts the pulse waveform into an intermediate analog waveform; and
an analog anti-aliasing filter that smoothes the intermediate analog waveform to provide an analog waveform.

9. A pulse generator comprising:
a fractional delay filter having input thereto a clock signal, an intermediate pulse signal and a delay signal, the clock signal having a clock cycle and the intermediate pulse signal having a plurality of pulses with leading and trailing edges aligned with edges of the clock signal,
the fractional delay filter having a plurality of impulse responses that are the same as each other and that are each provided with respective different delays that are a fraction of the clock cycle, and having a plurality of filter coefficients stored therein that are selectable responsive to the delay signal to output respective ones of the impulse responses as respective leading and trailing edges of an output pulse waveform having a desired pulse width and a desired period of repetition.

10. The pulse generator of claim 9, further comprising:
a phase accumulator that outputs a phase signal indicative of phase increments accumulated during each clock cycle of the clock signal; and
a pulse calculator that generates the intermediate pulse signal and the delay select signal, responsive to the phase signal, a pulse width signal identifying the desired pulse width and a repetition signal identifying the desired period of repetition.

11. The pulse generator of claim 10, wherein the pulse calculator comprises:
a leading edge calculator that generates a first signal that sets occurrence of leading edges and a first delay signal that sets an amount of leading edge delay, responsive to the phase signal and the repetition signal;
a counter that counts the clock cycles of the clock signal upon receipt of the first signal, responsive to the pulse width signal and an overflow signal, to provide a pulse width control signal;
a flip-flop that generates the intermediate pulse signal responsive to the first signal and the pulse width control signal;
an adder that adds the first delay signal and the pulse width signal to provide the overflow signal and a second delay signal that sets an amount of trailing edge delay; and
a selector that selectively provides the first delay signal and the second delay signal as the delay signal for each respective leading and trailing edge of the intermediate pulse signal.

12. The pulse generator of claim 11, wherein the repetition signal comprises a first component that is provided to the counter and that is an integer multiple of the clock cycle, and a second component that is provided to the adder and that is a fraction of the clock cycle less than one clock cycle.

13. The pulse generator of claim 9, wherein edge placement resolution of the fractional delay filter is less than 1 picosecond.

14. The pulse generator of claim 9, further comprising:
a digital to analog converter that converts the output pulse waveform into an intermediate analog waveform; and
an analog anti-aliasing filter that smoothes the intermediate analog waveform to provide an analog waveform.

15. A method of generating a pulse waveform, the method comprising:
accumulating phase increments of a clock signal during each clock cycle of the clock signal to provide a phase signal responsive thereto;
generating a delay signal and an intermediate pulse signal having pulses with leading and trailing edges aligned with edges of the clock signal, responsive to the phase signal, a pulse width signal identifying a desired pulse width and a repetition signal identifying a desired period of repetition; and
delaying at least one of the leading edge and the trailing edge of at least one of the pulses of the intermediate pulse signal by a fraction of the clock cycle in a fractional delay filter responsive to the delay signal, to provide the pulse waveform having the desired pulse width and the desired period of repetition.

16. The method of claim 15, wherein said generating comprises:
generating a first signal that sets occurrence of leading edges and a first delay signal that sets an amount of leading edge delay, responsive to the phase signal and the repetition signal;
counting clock cycles of the clock signal upon generation of the first signal, the pulse width signal and an overflow signal, to provide a pulse width control signal;
generating the intermediate pulse signal responsive to the first signal and the pulse width control signal;
adding the first delay signal and the pulse width signal to provide the overflow signal and a second delay signal that sets an amount of trailing edge delay; and
selectively providing the first delay signal and the second delay signal as the delay signal for each respective leading and trailing edge of the intermediate pulse signal.

17. The method of claim 16, wherein the repetition signal comprises a first component that is an integer multiple of the clock cycle and that is used during said counting, and a second component that is a fraction of the clock cycle less than one clock cycle and that is used during said adding.

18. The method of claim 15, wherein the fractional delay filter is a low pass filter having a plurality of impulse responses that are the same as each other and that are each provided with respective different delays that are a fraction of the clock cycle, wherein respective ones of the impulse responses are provided as respective leading and trailing edges of the pulse waveform responsive to the delay signal.

19. The method of claim 15, wherein edge placement resolution of said delaying is less than 1 picosecond.

20. The method of claim 15, further comprising:
converting the pulse waveform into an intermediate analog waveform; and
filtering that smoothes the intermediate analog waveform to provide an analog waveform.

* * * * *